US006625557B1

(12) United States Patent
Perkins et al.

(10) Patent No.: US 6,625,557 B1
(45) Date of Patent: Sep. 23, 2003

(54) MIXED SIGNAL DEVICE UNDER TEST BOARD INTERFACE

(75) Inventors: Philip E. Perkins, Needham, MA (US); William R. Creek, Fremont, CA (US); David W. Curry, Cohasset, MA (US)

(73) Assignee: LTX Corporation, Westwood, MA (US)

( * ) Notice: Subject to any disclaimer, the term of this patent is extended or adjusted under 35 U.S.C. 154(b) by 0 days.

(21) Appl. No.: 09/113,449

(22) Filed: Jul. 10, 1998

(51) Int. Cl.[7] .............................................. G01R 31/00
(52) U.S. Cl. ...................... 702/117; 324/755; 714/724
(58) Field of Search ............................. 702/117, 33, 34, 702/59, 60, 118, 120, 121, 122, 124, 126, FOR 103, FOR 104, FOR 134, FOR 170, FOR 171; 324/724, 763, 764, 754, 755; 714/727, 724

(56) References Cited

U.S. PATENT DOCUMENTS

| 3,866,119 A | * | 2/1975 | Ardezzone et al. | ......... 324/754 |
| 4,044,244 A | * | 8/1977 | Foreman et al. | ............ 714/724 |
| 4,807,161 A | * | 2/1989 | Comfort et al. | ............ 702/121 |
| 5,274,336 A | * | 12/1993 | Crook et al. | ................ 324/149 |
| 5,489,852 A | * | 2/1996 | Gomez | ........................ 324/754 |
| 5,519,331 A | * | 5/1996 | Cowart et al. | ............... 324/755 |
| 5,907,245 A | * | 5/1999 | Fredrickson | ............... 324/754 |
| 6,539,510 B1 | * | 3/2003 | St. Pierre, Jr. et al. | ..... 714/727 |

* cited by examiner

Primary Examiner—Marc S. Hoff
Assistant Examiner—Mohamed Charioui
(74) Attorney, Agent, or Firm—McDermott, Will & Emery

(57) ABSTRACT

A mixed signal integrated circuit testing system includes a system controller connected to a test head for controlling the testing operations of the mixed signal integrated circuit testing system. The test head is adapted to support a wide combination of both the analog and digital circuit testing modules. A DUT board, typically configured for a specific IC or family of ICs, is used to connect the circuit testing modules to the IC. The DUT board is connected to a DUT board interface that includes an analog DUT board interface adapter and a digital DUT board interface adapter. The digital DUT board interface adapter is connected directly to the digital circuit testing modules. The analog DUT board interface adapter is connected to a system configuration module that provides analog loading and conditioning circuitry as well as other circuitry that can be customized for testing specific ICs.

22 Claims, 3 Drawing Sheets

MIXED SIGNAL DEVICE UNDER TEST BOARD INTERFACE

CROSS-REFERENCE TO RELATED APPLICATIONS

Not Applicable

STATEMENT REGARDING FEDERALLY SPONSORED RESEARCH

Not Applicable

REFERENCE TO MICROFICHE APPENDIX

Not Applicable

BACKGROUND OF THE INVENTION

This invention relates to high performance mixed signal integrated circuit (IC) testing systems and, more particularly, to a mixed signal device under test (DUT) board interface adapted to provide high functionality by providing high quality and high density analog and digital testing and signal connections to the IC device being tested.

IC testing systems typically test ICs either before a die bearing the circuit is detached from a wafer or after the IC is packaged on a chip carrier. Depending upon the functionality of the IC, the IC testing system may require both analog and digital signal testing circuitry as well as different types of analog or digital circuitry. As used herein, mixed signal testing is intended to include not only hybrid analog and digital signal testing, but also combinations of different types of analog or digital signal testing, for example general purpose analog and high speed analog, audio and video, or digital and high speed digital signals). For example, digital audio and video ICs used in Compact Disc and video disc players process digital signals as well as generate analog signals used to produce the analog sounds or video images. As these components increase in functionality and become more complex, the IC testing systems required to test these components must increase, not just in signal testing density (i.e. the number of digital or analog circuits that can be tested) but also in the mix or diversity of signal types (i.e. digital signals, audio signals, video signals, radio frequency signals, power signals, power control signals, etc.) that can be tested.

In order to test an IC on a wafer, typically, the test electronics which include individual circuit testing modules, are mounted in a test head at one end of an articulated arm. The test head can accommodate a plurality of different types of circuit testing modules, including for example, digital circuit testing modules (also referred to as Digital Pin Electronics Cards) and analog circuit testing modules which can include audio, video and/or RF circuit testing instrumentation. Mounted on one surface of the test head is the device under test board or DUT board. The DUT board includes a printed circuit board or similar electronic interconnect board that receives signals from a DUT board interface and connects them to the appropriate points of the device under test (e.g. the IC) on the wafer. The DUT board is sized to fit into an opening in the wafer handler, generally less than 12 inches in diameter. Once the DUT board is positioned in the opening, the wafer handler moves the wafer in position to allow probe pins on the DUT board to contact the appropriate points of the IC on the wafer in order to allow testing of various circuit elements of the IC.

In order to test a packaged IC, a different type of DUT board is used. This type of DUT board includes a socket that is adapted to receive the packaged IC and make electrical contact with the leads of the package in order to connect the circuit testing modules to the IC. In this embodiment, a part handling device, such as a pick and place robotic manipulator, is used to pick up the packaged IC and position it in the socket to be tested. The test head and the DUT board remain stationary during this process.

In typical analog circuit testing applications, it is often necessary to provide signal conditioning circuitry between the digital or analog circuit testing modules and the IC. This signal conditioning circuitry is typically provided on a load board which is inserted in the signal path between the circuit testing module and the DUT board. One of the disadvantages of using a load board in mixed signal applications is that the length of the signal path between the circuit testing modules and the IC is increased and consequently, the digital signal testing performance is decreased. In addition, the space available for signal conditioning circuitry on the load board becomes limited as the analog and digital testing channel density increases.

Accordingly, it is an object of this invention to provide an improved mixed signal integrated circuit testing system.

It is another object of this invention to provide an improved mixed signal integrated circuit testing system adapted to provide high performance digital signal testing.

It is a further object of this invention to provide an improved mixed signal integrated circuit testing system adapted to provide high density analog and digital signal testing instrumentation.

It is a still further object of this invention to provide an improved mixed signal integrated circuit testing system adapted to provide high density analog and digital signal testing instrumentation and increased load board signal conditioning capacity.

It is a still further object of this invention to provide an improved mixed signal integrated circuit testing system adapted to provide high density mixed signal testing instrumentation which can provide substantially the short signal delays need to test one type of circuitry as well as provide a replaceable or reconfigurable system configuration module for providing different types of signal conditioning circuitry.

SUMMARY OF THE INVENTION

The present invention is directed to mixed signal circuit testing systems adapted for testing highly integrated circuits (ICs) which can include various types of high performance digital and analog circuitry. The analog circuit types can include, for example, audio, video, power, power control, and radio frequency. In accordance with the invention, the mixed signal circuit testing system is adapted to provide high signal testing channel density as well as high performance digital signal test functions and diverse analog signal testing functionality. The system is also adapted to conform to conventional physical size requirements for testing ICs on a wafer and thus can serve to replace prior art integrated circuit testing systems.

The testing function of a system in accordance with the invention is accomplished by removably connecting (such as by means of a socket or pin probes) at least a portion of the IC to an analog and/or digital test module. The test modules can include the signal generating and signal measuring instrumentation necessary to perform a broad range of analog or digital test functions A mixed signal IC testing system in accordance with the present invention includes a system controller adapted for controlling a first type of circuit testing module and a second type of circuit testing module. The circuit testing modules are mounted in a test head and operatively coupled to the system controller. A DUT board provides a means for connecting the mixed signal IC testing system to the IC being tested. The DUT board is mounted to a DUT board interface adapter which defines the DUT board interface. The first type of circuit testing module is operatively connected to a first portion of a DUT board interface adaptor via a first interconnect coupling. The second type of circuit test module is operatively coupled to a second portion of the DUT board interface adapter via a system configuration module. The system configuration module is connected to the second portion of the DUT board interface adapter via a second interconnecting coupling and to the second type of circuit testing module via a third interconnect coupling. The system configuration module can be removable in order to provide the flexibility to test a wide range of circuit types as well as a varying mix of circuit types and configuration.

The DUT board interface adapter can include a first interface adapter element nested with a second interface adapter element. The first interface adapter element can be connected to the first type of circuit testing module and the second interface adapter element can be connected to the second type of circuit testing module. In one embodiment, the first interface adapter element can be connected exclusively to one type of circuit testing module, for example, the digital type circuit testing modules. In another embodiment, the first interface adapter element can be connected exclusively to one type of circuit testing module and the second interface adapter element can be connected exclusively to a different type of circuit testing module. The first interface adapter element can include a circular peripheral portion that is adapted to nest with a circular opening in the second interface adapter element. Alternatively, the first interface adapter element can include an annular ring and the second interface adapter element can include an annular ring that is adapted to nest concentrically with the first interface adapter element. In an alternative embodiment, the DUT board interface adapter can be mounted to the test head via a compliant coupling to permit the DUT board interface adapter to move slightly relative to the test head.

In accordance with the present invention, the mixed signal DUT board interface is supported by a test head that includes at least one of the first type of circuit testing module and at least one of the second type of circuit testing module. In one preferred embodiment, the first type of circuit testing module is a digital circuit testing module adapted for testing digital circuits and the second type of circuit testing module is an analog circuit testing module adapted for testing analog circuits. The mixed signal DUT board interface includes a first interface adapter element, adapted for engaging a DUT board, and for operatively coupling at least one of the digital circuit testing modules to the DUT board to permit high performance digital signal testing of an IC coupled to the DUT board. The digital circuit testing module or modules are connected to the DUT board interface adapter via the first interconnect coupling or the digital interconnect coupling. The mixed signal DUT board interface also includes an analog interconnect adapted for coupling at least one of the analog circuit testing modules to a system configuration module to permit analog testing signals to be transferred between the analog circuit testing modules and the system configuration module.

The mixed signal DUT board interface can further include a system configuration module operatively connected to the analog circuit testing module via the second interconnect coupling. The system configuration module can include a second DUT board interface adapter coupled to the system configuration module permitting analog test signals to be transferred between the second DUT board interface adapter and the analog circuit testing module. The system configuration module can be connected to the DUT board interface adapter via the second interconnect coupling and to the second type of signal testing module or modules via the third interconnect coupling. In one embodiment, the first DUT board interface adapter and the second DUT board interface adapter are disposed in a common plane. Alternatively, the first DUT board interface adapter and the second DUT board interface adapter can be adapted to provide an interface for the DUT board that is disposed in a common plane.

The system configuration module is adapted for interconnecting signal conditioning circuitry to condition the analog test signals transferred between the analog circuit testing module and the second DUT board interface adapter. The system configuration module can be disposed in the same common interface plane as first DUT board interface adapter and the second DUT board interface adapter. Alternatively, the system configuration module can be disposed in a plane that is spaced apart from the interface plane.

The interface is adapted to connect the analog and digital test signals to a DUT board which is adapted to connect the analog and digital test signals to an integrated circuit. The first interface adapter element can include a plurality of digital interface elements operatively coupled to a digital circuit test module and the second interface adapter element can include a plurality of analog interface elements operatively coupled to an analog circuit test module.

The DUT board can include a plurality of DUT interface elements adapted to engage a set of the digital interface elements to permit digital test signals to be transferred between the DUT board and the digital circuit testing module and to engage a set of the analog interface elements to permit analog test signals to be transferred between the DUT board and the analog circuit testing module Alternatively, the interface can be adapted to connect two or more different types of digital (or analog) test signals to a DUT board which is adapted to connect a plurality of types of test signals to an integrated circuit. The first interface adapter element can directly connect the one type of digital (or analog) signal testing module to the DUT board and the second interface adapter element can connect a second type of digital (or analog respectively) signal testing module to the DUT board via the system configuration module, thereby providing any necessary signal conditioning or loading circuitry between the signal testing module and the DUT board.

DESCRIPTION OF THE DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENTS

Figure 1:
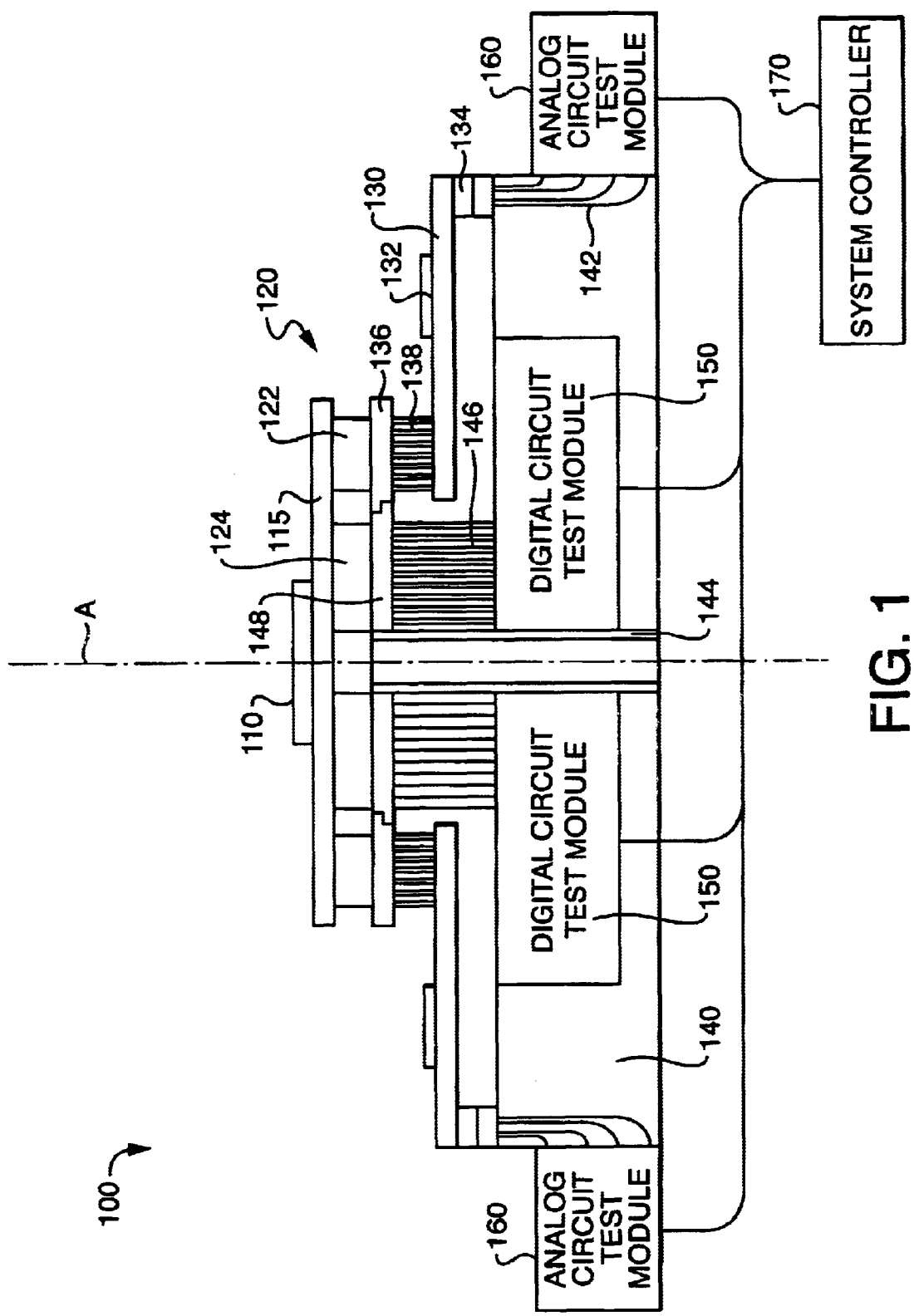
FIG. 1 is a diagrammatic view, in section, of a mixed signal integrated circuit testing system in accordance with the present invention.
Figure 2:
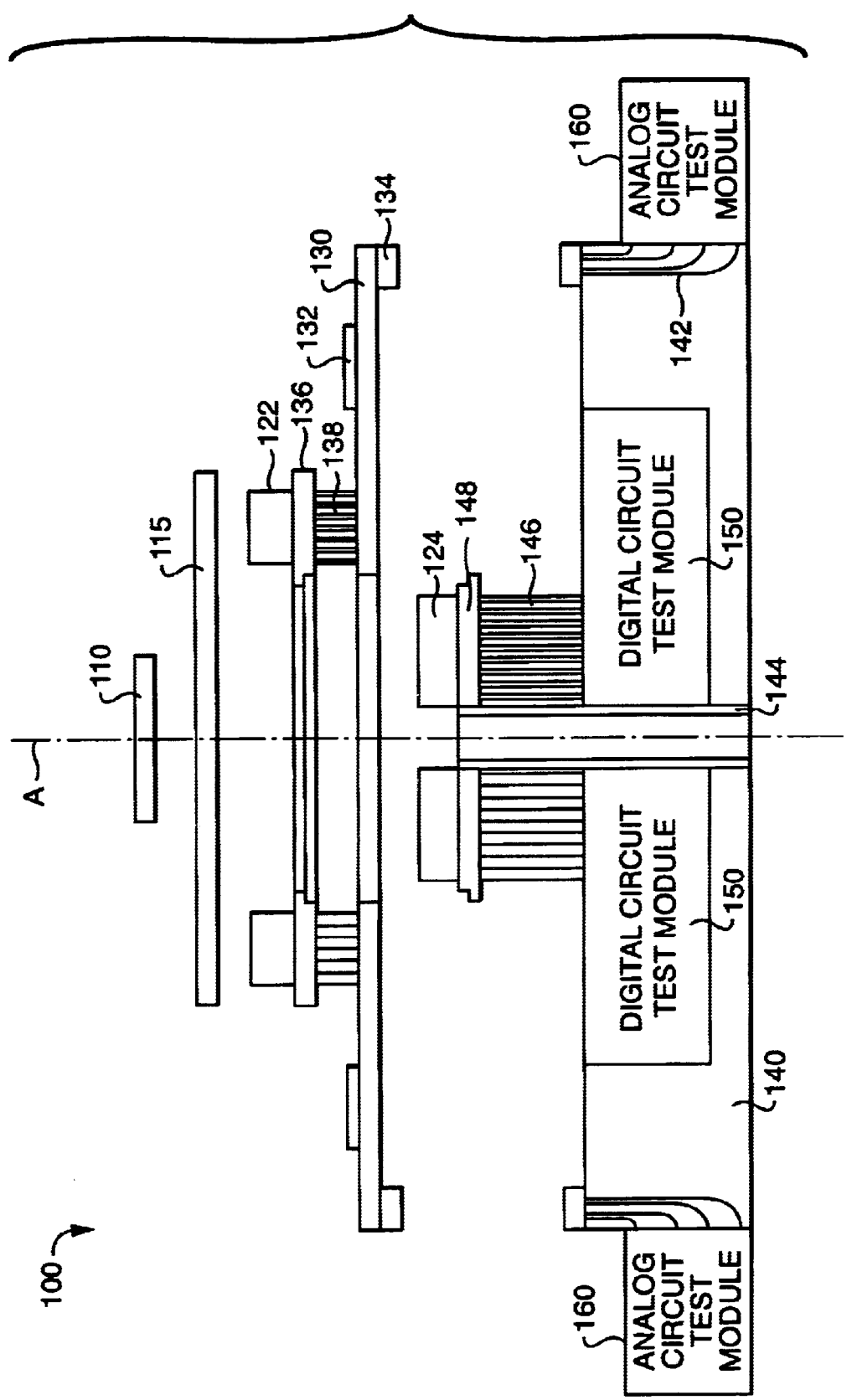
FIG. 2 is an exploded diagrammatic view, in section, of a mixed signal integrated circuit testing system in accordance with the present invention.

FIGS. 1 and 2 show a mixed signal integrated circuit testing system 100 in accordance with the present invention.

The system 100 is adapted to test an integrated circuit 110 (or device under test or "DUT") which is positioned on a DUT board 115. System 100 has a generally cylindrical geometry disposed about a reference axis A although, a polygonal geometry may be used. System 100 includes a system controller 170 connected to a plurality of analog circuit test modules 160 and digital circuit testing modules 150. The analog and digital circuit test modules 150 and 160 are supported by a cylindrical test head 140. A tubular coupling element 144 extends upwardly (as shown) along axis A from tester head 140. An inner DUT board interface ring 148 is fixedly or resiliently coupled to the distal end of coupling element 144. A peripheral portion of inner DUT board interface ring 148 releasably and resiliently (via bushing 112) supports an outer DUT board interface ring 136. The digital circuit test modules 150 are directly connected to an inner DUT board interface ring 148 by digital interconnect wiring 146. The analog circuit test modules 160 are connected to a system configuration module 130 by analog interconnect wiring 142. Analog interconnect wiring 142 is coupled to module 130 by connector 134, which allows the system configuration module 130 to be disconnected from the test head 140. The system configuration module 130 is connected to the outer DUT board interface ring 136 by analog interconnect wiring 138. Analog DUT board interface elements 122 and digital DUT board interface elements 124 define the DUT board interface which connects to mating DUT board interface elements on the DUT board 115 and electrically connects the analog and digital test signals to the integrated circuit 110.

Each circuit testing module includes circuitry adapted to send and/or receive signals to the IC in order to preform the desired testing functionality. Typically, the digital circuit testing modules can include circuitry adapted to perform digital IC test functions and the analog circuit testing modules include circuitry adapted to perform analog IC test functions. As a person having ordinary skill in the art will appreciate, the individual circuit testing modules can include both digital and/or analog circuitry.

In the preferred embodiment, the test head 140 includes a chassis supported by a hydraulically actuated manipulator arm (not shown). The position of the arm is controlled by the system controller in order to position the test head 140 relative to an IC wafer handler or an automated pick and place system for testing packaged ICs. The test head 140 houses a plurality of digital and analog circuit testing modules 150 and 160.

In the preferred embodiment, each digital circuit testing module 150 is provided in the form of a printed circuit board which includes 16 high performance testing channels per card. The test head 140 can accommodate up to 64 cards in order to provide a total of 1024 digital testing channels (e.g. 1024 signal and 1024 ground leads). In the preferred embodiment, each digital circuit test module includes an LTX type 865-7393-01 HiPER II digital pin electronics card available from LTX Corporation of Westwood, Mass. Each channel can be adapted to perform any one of a number of digital circuit test functions including measuring various digital signal characteristics including, for example, measuring signal response, logic function and timing. Preferably, the distance from the digital circuit test module to the integrated circuit is sufficiently short, whereby the signal delay from digital driver to DUT is less than 2 nanoseconds. As one of ordinary skill will appreciate, each of the digital circuit testing modules 150 can have more or less digital testing channels and different types of digital testing modules can be used.

In the preferred embodiment, each analog circuit testing module 160 is provided in the form of a printed circuit board which includes up to eight analog testing channels per card. The test head 140 can accommodate up to 40 cards requiring as many as 2208 analog test connections and providing as many as 160 analog test channels. Each of the analog circuit testing modules 160 can be adapted to test a particular type of analog signal such as audio, video, power, power control and radio frequency signals. In the preferred embodiment, the testing system includes 32 slots for several different types of analog and mixed signal circuit testing modules and 8 slots for multiple combinations of RF and power testing modules. In one preferred embodiment, the testing system can include, for example: eight LTX type 865-2524-00 eight channel general purpose analog circuit testing modules, 16 LTX type 865-2742-00 single channel high performance analog circuit testing modules, one LTX type 865-2597-00 single channel high performance analog circuit testing module, one LTX type 865-2714-00 analog RF circuit testing modules, one LTX type 865-1891-00 audio circuit testing module, four LTX type 865-2794-00 power/power control analog circuit testing modules and four LTX type 858-4333-00 analog RF circuit testing modules, all available from LTX Corporation of Westwood, Mass. The empty slots provide for future user expansion. Each channel can be adapted to perform any one of a number of analog circuit test functions including measuring various analog signal characteristics as well as measuring signal response and timing, and for example generating stimulus or input signals (e.g. DC, audio, video, RF and power signal levels) and measuring the response signals (e.g. DC, audio, video, RF and power signal levels) generated by the device under test. As one of ordinary skill will appreciate, each of the analog circuit testing modules 160 can have more or less analog testing channels and other configurations of testing modules can be used.

The system configuration module 130 is adapted to interconnect signal conditioning circuitry 132 between the analog circuit testing module 160 and the integrated circuit under test. In the preferred embodiment, the system configuration module 130 includes at least 100 square inches of space to accommodate signal conditioning circuitry 132. A specific system configuration modules 130 can be configured to test a specific IC or family of ICs. The system configuration module 130 can be removable to allow the test head 100 to be used to test a very wide range of circuits and IC's.

In the preferred embodiment, the DUT board interface 120 includes an analog interconnect system 122 and a digital interconnect system 124 which electrically interconnect the DUT board 115 to the analog circuit testing modules 160 and the digital circuit testing modules 150. The analog interconnect system 122 and the digital interconnect system 124 can include any type of electrical interconnect. Either the analog interconnect system 122 or the digital interconnect 124 (or both) can include a locking system which couples the DUT board to the DUT board interface and the outer DUT board interface ring 136 or the inner DUT board interface ring 148 (or both). In the preferred embodiment, both the analog interconnect system 122 and the digital interconnect system 124 utilize spring loaded pins, (or "POGO PINS", shown in FIG. 3) mounted to the inner and outer DUT board interface rings 122, 124 which engage mating pads on the DUT board 115 to create an electrical connection between the DUT board 115 and the analog and digital circuit testing modules 150, 160. The DUT board 115 can include a conventional probe card to permit the test system 100 to create an electrical connection with an IC on a wafer or an IC socket adapted to create an electrical connection with a packaged IC.

FIG. 2 shows an exploded view the mixed signal IC testing system 100. The test head 140 supports the digital circuit testing modules 150, the analog circuit testing modules 160 as well as any circuitry (not shown) to provide power to the circuit testing modules. In addition, the test head 140 can include a cooling system (not shown) for dissipating the heat generated by the circuit testing modules. The inner DUT board interface ring 148 is mounted to the test head 140 by coupling 144. Preferably, coupling 144 is securely fixed to the inner DUT board interface ring 148. Alternatively, coupling 144 can be compliant or includes a compliant portion to allow the inner DUT board interface ring 148 to move as much as 0.200 inches relative to the test head 140.

The outer DUT board interface ring 136 is connected to the system configuration module 130 by analog interconnect wiring 138. Preferably, the outer DUT board interface ring 136 is also connected to the system configuration module 130 by a compliant coupling (not shown). The outer DUT board interface ring 136 can include a rabbet that mates with a complementary rabbet on the outer edge of the inner DUT board interface ring 148. The system configuration module 130 and the outer DUT board interface ring 136 form a system configuration module assembly that can be configured for a specific IC or family of ICs (e.g. a group of ICs having similar functionality). In the preferred embodiment, the signal conditioning elements 132 mounted to the system configuration module 130 are selected to permit testing of a specific IC or a family ICs and different system configuration module assemblies are installed on the test head 140 as necessary depending upon the IC or family of ICs to be tested. The DUT board 115 is adapted to be mounted to the DUT board interface which is formed by nesting the outer DUT board interface ring 136 around the inner DUT board interface ring 148. Each DUT board 110 is configured for testing a specific integrated circuit or family of ICs.

Figure 3:
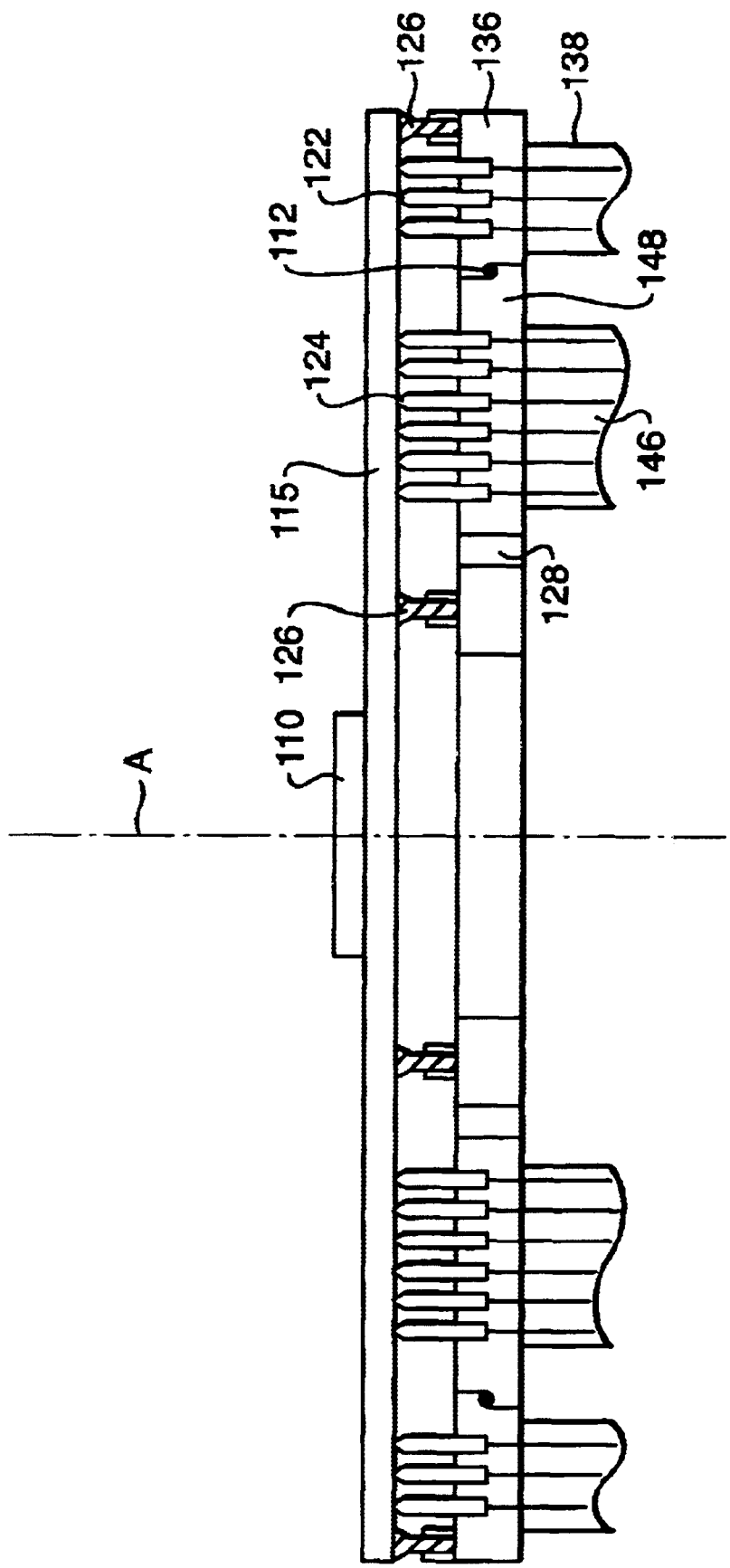
FIG. 3 is a diagrammatic view of a DUT board interface adapter in accordance with the present invention.

FIG. 3 shows the DUT board 115 mounted to the nested inner and outer DUT board interface rings 136, 148 in accordance with a preferred embodiment of the present invention. The analog circuit testing signals are connected the DUT board 115 via POGO PINS 122 mounted to the outer DUT board interface ring 136 and the digital circuit testing signals are connected the DUT board 115 via pogo pins 124 mounted to the inner DUT board interface ring 148. In this embodiment, both the inner and outer DUT board interface rings 148, 136 include a sealing gasket 126 which engage the bottom surface of the DUT board 115. An O-ring seal 112 is provided between the inner DUT board interface ring 148 and the outer DUT board interface rings 136. Thus, when the DUT board 115 is positioned on the POGO PINS 122, 124 and the sealing gaskets 126, a substantially sealed chamber is formed which can be evacuated by the application of a vacuum pressure to pressure port 128 to securely mount the DUT board to the DUT board interface. The amount of vacuum pressure is determined as a function of the number of pogo pins and the pressure required to compress each pin. As one of ordinary skill will appreciate, other types of clamping mechanisms (such as screws or bayonet pins) can be used to fasten the DUT board to the DUT board interface and it is not necessary for all the POGO PINS to be located in the evacuated chamber. In the preferred embodiment, additional connectors (not shown) adapted for connecting RF testing signals to the DUT board 115 are mounted to the outer DUT board interface ring 136 outside of the evacuated chamber.

In operation, the system controller 170 contains a program for testing the IC 110 including controlling the application of power to power up the IC 110, applying analog and digital signals to initialize the IC 110 and applying analog and digital test signals in order to measure signal responses generated by and received from the IC 110 under test. The digital signals travel between the IC 110 and the digital pin driver on the digital circuit testing modules 150 along a relatively short path (less than 2 nanoseconds travel time) that includes the digital signal interconnect 146 to the pogo pins 124 in the inner DUT board interface ring to the pogo pin contact pads (not shown) on the bottom of the DUT board 115. The DUT board includes a printed circuit board with lands that run from the pogo pin pads on the bottom of the DUT 115 board to lands on the top of the DUT board 115, typically using blind via technology (because plated through hole technology would prevent the use of vacuum to mount the DUT board to the DUT board interface rings). The lands on the top of the DUT board are connected to either a socket if the DUT board 115 is used to test packaged ICs or pin probes if the DUT board is used to test the IC on a wafer.

In a similar fashion, the analog test signals travel between the IC 110 and the analog circuit testing modules 160 along a slightly longer path that includes the analog signal interconnect 142, the connector 134 and the system configuration module 130. The system configuration module 130 can include signal conditioning circuitry as well as other application specific circuitry used to enhance the test function for the specific IC or family of ICs. The path from the system configuration module includes the analog signal interconnect 138, the POGO PINS 122 in the outer DUT board interface ring 136 to pogo pin contact pads on the bottom of the DUT board 115. Like the digital signals, pogo pin contact pads on the bottom of the DUT board are connected to either a socket or pin probes depending upon whether the system is adapted for testing a packaged IC or an IC on a wafer. In the preferred embodiment, the system configuration module 130 receives 2208 connections in and allows the user to selectively connect as many as 512 connections to the DUT board 115. In addition, the system configuration module 130 allows a single device pin to be connected to a plurality of signal testing channels and different system configuration modules 130 can be utilized to test different device types.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. An integrated circuit testing system for testing integrated circuits (ICs) including a plurality of signal types, said mixed signal integrated circuit testing system comprising:
   a system controller adapted for controlling a first type of circuit test module and a second type of circuit test module;
   a test head including a first type of circuit test module operatively coupled to said system controller and at least a second type of circuit test module operatively coupled to said system controller;
   a device under test (DUT) board adapted for operatively coupling an integrated circuit device to test signals generated by a first type of circuit test module and a second type of circuit test module, said DUT board including a plurality of DUT board interface elements disposed in a first plane, wherein said first type of circuit test module and said second type of circuit test module are disposed in close proximity to said DUT, the test signals corresponding to the first type of test module are arranged in a first group, and the test signals corresponding to the second type of test module are arranged in a second group, separate from the first group;

a DUT interface adaptor adapted for coupling said DUT board to said test signals generated by a first type of circuit test module and a second type of circuit test module, said DUT interface including a plurality of adaptor interface elements disposed in said first plane and adapted for engaging and establishing a connection with a predetermined set of said DUT board interface elements;

a first interconnect coupling at least a first portion of said DUT board interface elements directly to said first type of circuit test module;

a second interconnect coupling at a least a second portion of said DUT board interface to a system configuration module, said system configuration module being adapted for including signal conditioning circuitry;

a third interconnect coupling said system configuration module to said second type of circuit test module.

2. An integrated circuit testing system according to claim 1 wherein said DUT interface adapter comprises a first interface adapter element nested with a second interface adapter element.

3. An integrated circuit testing system according to claim 2 wherein said first interface adapter element includes an annular ring and said second interface adapter element includes an annular ring adapted to nest concentrically with said first interface adapter element.

4. An integrated circuit testing system according to claim 5 wherein said first interface adapter element is connected to said first type of circuit testing module and said first type of circuit testing module includes a digital circuit testing module and said second interface adapter element is connected to said second type of circuit testing module and said second type of circuit testing module includes an analog circuit testing module.

5. An integrated circuit testing system according to claim 2 wherein
said first interface adapter element is connected to said first type of circuit testing module and said second interface adapter element is connected to said second type of circuit testing module.

6. An integrated circuit testing system according to claim 2 wherein said first interface adapter element includes a circular peripheral portion adapted to nest with a circular opening in said second interface adapter element.

7. An integrated circuit testing system according to claim 1 wherein said first type of circuit testing module includes a digital circuit testing module.

8. An integrated circuit testing system according to claim 7 wherein the second type of circuit testing module includes a digital circuit testing module.

9. An integrated circuit testing system according to claim 1 wherein said first type of circuit testing module includes an analog circuit testing module.

10. An integrated circuit testing system according to claim 9 wherein the second type of circuit testing module includes an analog circuit testing module.

11. An integrated circuit testing system according to claim 1 wherein said DUT interface adapter includes a plurality of spring loaded pins adapted for engaging complementary interface elements on said DUT board and fastening means for fastening said DUT board in a predefined position and orientation with respect to said DUT interface adapter.

12. An integrated circuit testing system according to claim 11 wherein said DUT interface adapter includes sealing means adapted for engaging said DUT board and said fastening means includes means adapted for creating and maintaining a vacuum between said DUT interface adapter and said DUT board.

13. A device under test (DUT) board interface for a mixed signal integrated circuit test system, said mixed signal integrated circuit test system including a first type of circuit testing module and a second type of circuit testing module, said mixed signal DUT board interface comprising:

a test head supporting at least one of said first type of circuit testing module and at least one of said second type of circuit testing module, a first DUT board interface adapter, adapted for engaging a DUT board, operatively coupled to said at least one of said first type of circuit testing module to permit a first type of test signals to be transferred between said first DUT board interface adapter and said first type of circuit testing module, wherein said first type of circuit testing module and said second type of circuit testing module are disposed in close proximity to said DUT board, the test signals corresponding to the first type of testing module are arranged in a first group, and the test signals corresponding to the second type of testing module are arranged in a second group, separate from the first group;

a first interconnect adapted for operatively coupling said at least one of said second type of circuit testing module to a system configuration module to permit a second type test signals to be transferred between said second type of circuit testing module and said system configuration module.

14. A DUT board interface according to claim 13 wherein said first DUT board interface adapter and said second DUT board interface adapter are disposed in a common interface plane.

15. A DUT board interface according to claim 14, wherein said system configuration module is disposed in a plane spaced apart from said interface plane.

16. A DUT board interface according to claim 13 wherein said first type of circuit testing module includes a digital circuit testing module and said first type of test signals include digital test signals.

17. A DUT board interface according to claim 16 wherein the second type of circuit testing module includes a digital circuit testing module and said second type of test signals include digital test signals.

18. A DUT board interface according to claim 13 wherein said first type of circuit testing module includes an analog circuit testing module and said first type of test signals include analog test signals.

19. A DUT board interface according to claim 18 wherein the second type of circuit testing module includes an analog circuit testing module and said second type of test signals include analog test signals.

20. A DUT board interface according to claim 13 further comprising: p1 a system configuration module operatively connected to said second interconnect, said system configuration module including a second DUT board interface adapter operative connected to said system configuration module permitting said second type of test signals to be transferred between said system configuration module and said second type of circuit testing module.

21. A DUT board interface according to claim 13 further comprising a DUT board removably coupled to at least one of said first DUT board interface adapter and said second DUT board interface adapter,
- said first DUT board interface adapter including a plurality of a first type of interface elements operatively coupled to said first type of circuit test module;
- said second DUT board interface adapter including a plurality of a second type of interface elements operatively coupled to said second type of circuit test module; and
- said DUT board including a plurality of DUT interface elements adapted to engage a set of said first type of interface elements to permit said first type of test signals to be transferred between said DUT board and said first type of circuit testing module and a set of said second type of interface elements to permit said second type of test signals to be transferred between said DUT board and said second type of circuit testing module.

22. A DUT board interface according to claim 13 wherein said first type of circuit testing module includes a digital circuit testing module and said first type of test signals include digital test signals and the second type of circuit testing module includes an analog circuit testing module and said second type of test signals include analog test signals.

* * * * *

UNITED STATES PATENT AND TRADEMARK OFFICE
CERTIFICATE OF CORRECTION

PATENT NO.    : 6,625,557 B1                                                       Page 1 of 1
DATED         : September 23, 2003
INVENTOR(S)   : Perkins et al.

It is certified that error appears in the above-identified patent and that said Letters Patent is hereby corrected as shown below:

Column 9,
Line 23, after "coupling", delete "at a least", and insert thereof -- at least --.

Signed and Sealed this

Third Day of February, 2004

JON W. DUDAS
*Acting Director of the United States Patent and Trademark Office*